United States Patent
Kita

(10) Patent No.: US 7,927,111 B2
(45) Date of Patent: Apr. 19, 2011

(54) ELECTRICAL JUNCTION BOX

(75) Inventor: Yukinori Kita, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/648,336

(22) Filed: Dec. 29, 2009

(65) Prior Publication Data

US 2010/0203746 A1     Aug. 12, 2010

(30) Foreign Application Priority Data

Feb. 12, 2009   (JP) .................................. 2009-029325

(51) Int. Cl.
*H01R 12/00*     (2006.01)
(52) U.S. Cl. ..................................................... 439/76.2
(58) Field of Classification Search ................. 439/76.1, 439/76.2, 733.1, 949
See application file for complete search history.

(56) References Cited

U.S. PATENT DOCUMENTS

| | | | |
|---|---|---|---|
| 4,255,004 A * | 3/1981 | Kourimsky et al. | ............ 439/65 |
| 7,320,608 B2 | 1/2008 | Kubota et al. | |
| 7,566,230 B2 | 7/2009 | Ozawa et al. | |
| 2006/0046536 A1 | 3/2006 | Yomura | |
| 2006/0084294 A1 | 4/2006 | Kita | |
| 2006/0131045 A1 | 6/2006 | Okada | |
| 2008/0153339 A1 | 6/2008 | Suzuki et al. | |
| 2010/0051311 A1 | 3/2010 | Nakagawa | |

FOREIGN PATENT DOCUMENTS

JP        2008-53079         3/2008

* cited by examiner

*Primary Examiner* — Khiem Nguyen

(74) *Attorney, Agent, or Firm* — Greenblum & Bernstein, P.L.C.

(57) ABSTRACT

To provide an electrical junction box wherein terminals juxtaposed in the box can be supported, when fuses or the like are fitted in the terminals. An electrical junction box is provided on an outer surface with electrical component containing sections. Terminals are juxtaposed in the containing sections. The terminals are connected to an internal circuit member. Each terminal is provided on opposite side edges in a width direction with recesses or protrusions. Support pins project from the electrical junction box or an insulation plate contained in the box so that each support pin is disposed between the adjacent terminals to extend in a direction perpendicular to the terminals and is fitted in the recesses or protrusions.

8 Claims, 8 Drawing Sheets

[Fig. 1]
(A)
(B)
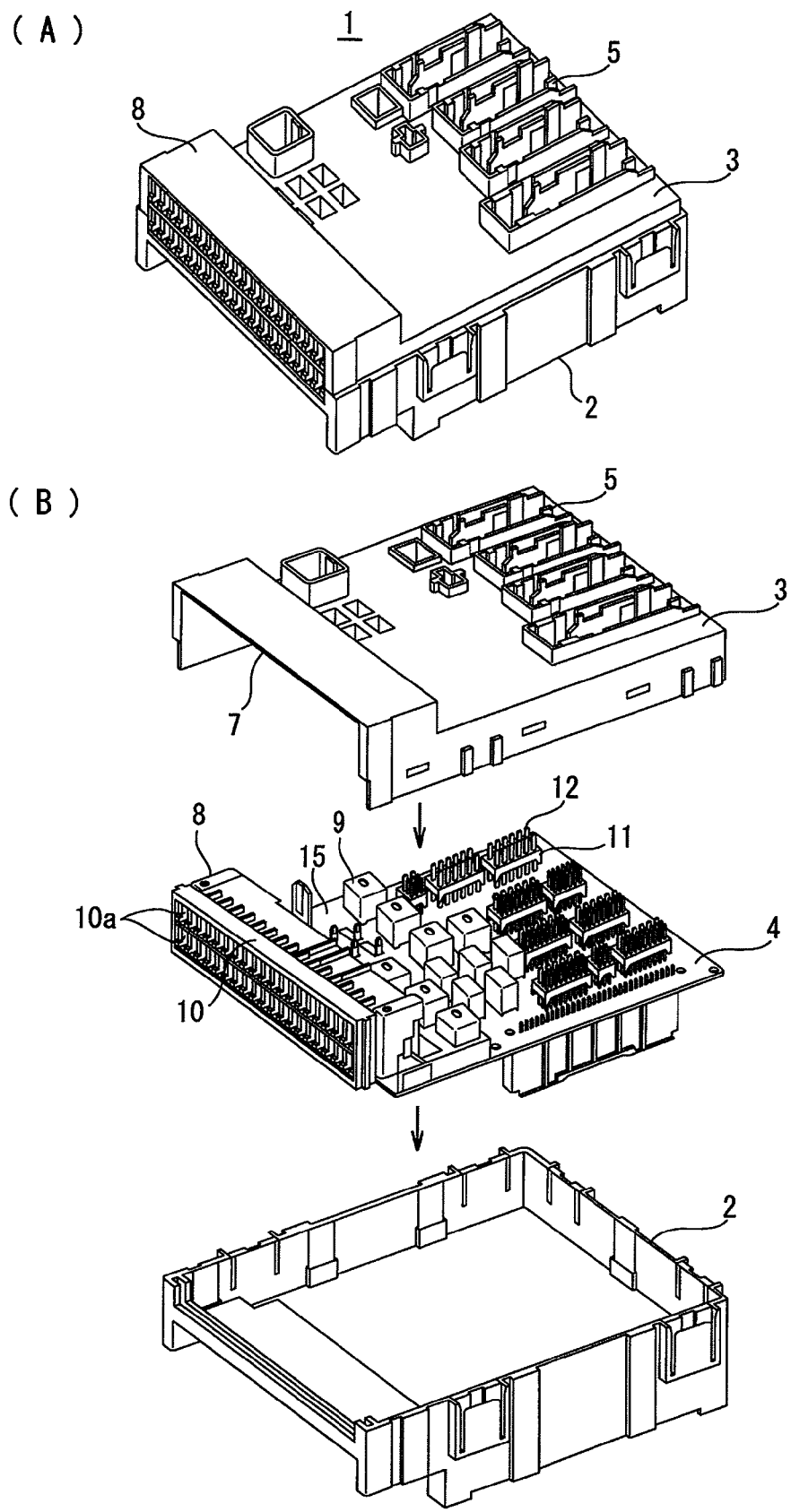

[Fig. 2]
(A)
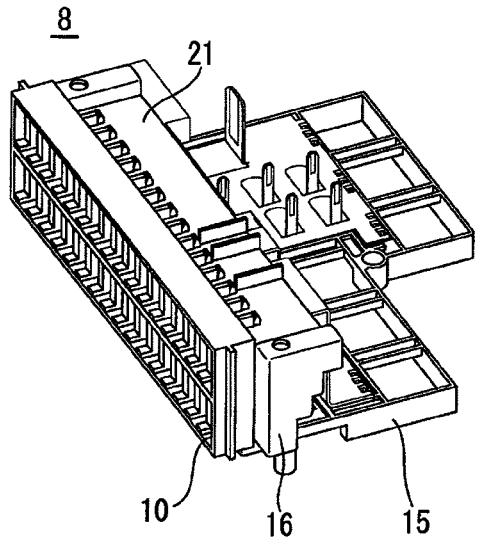
(B)
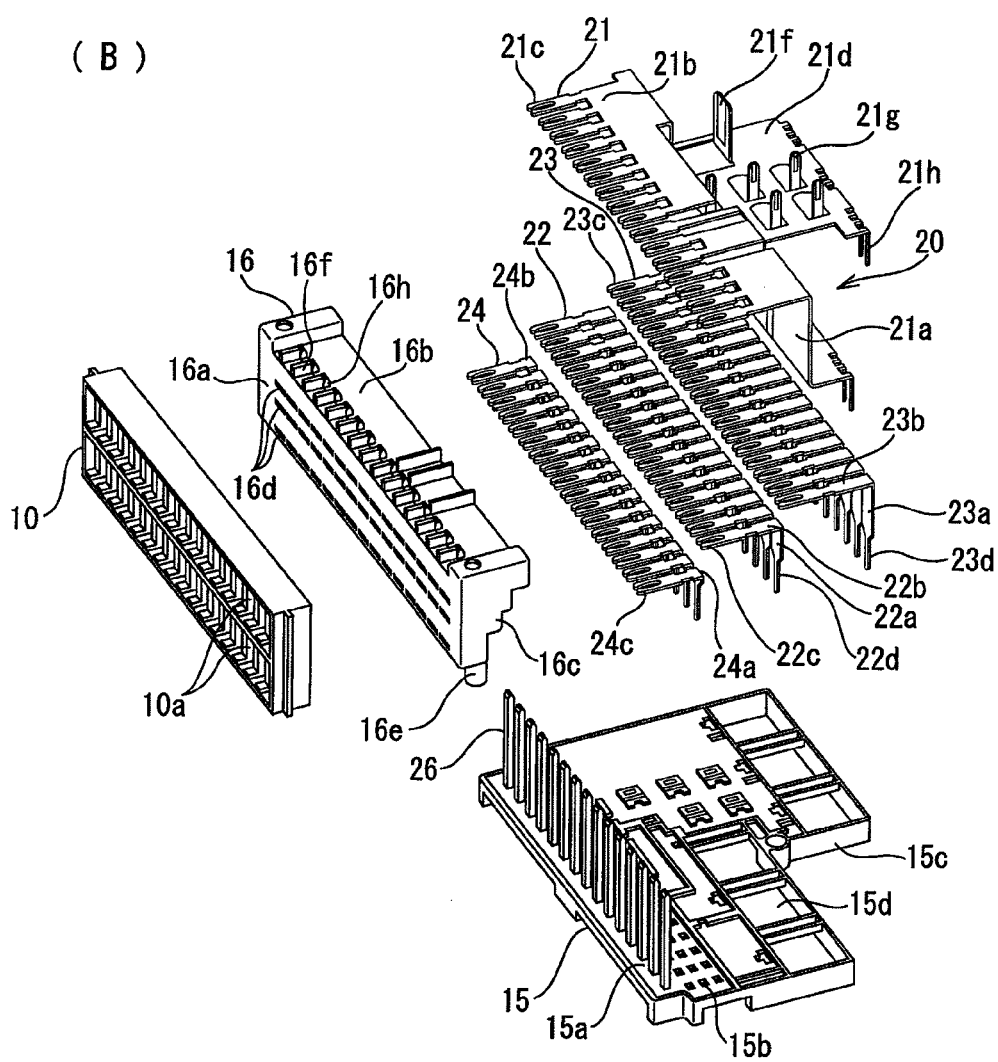

[Fig. 3]
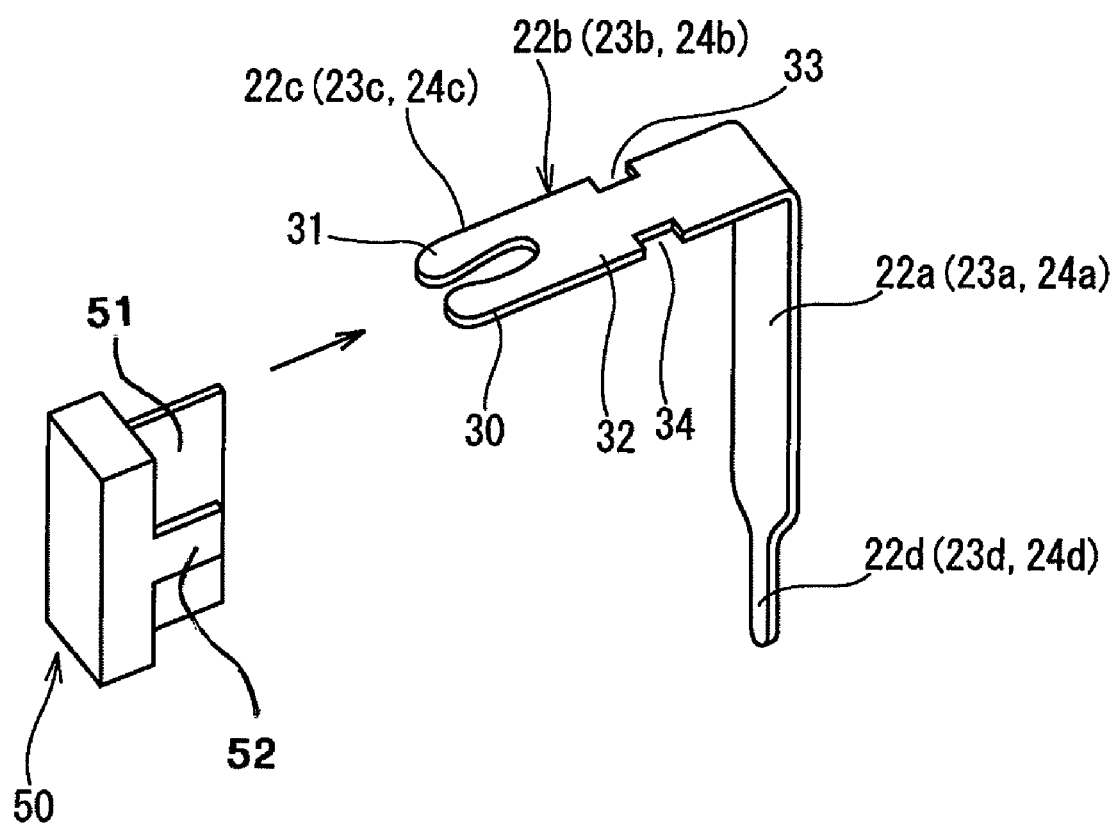

[Fig. 4]
(A)
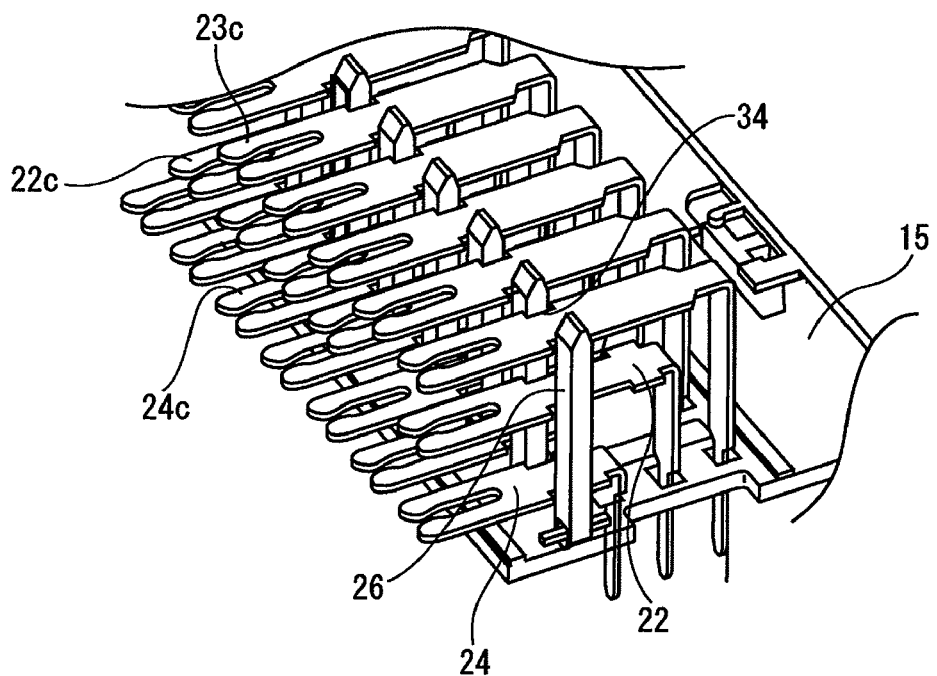
(B)
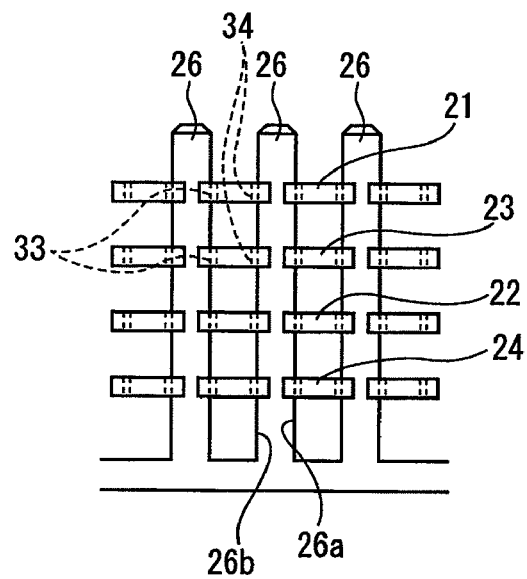

[Fig. 5]
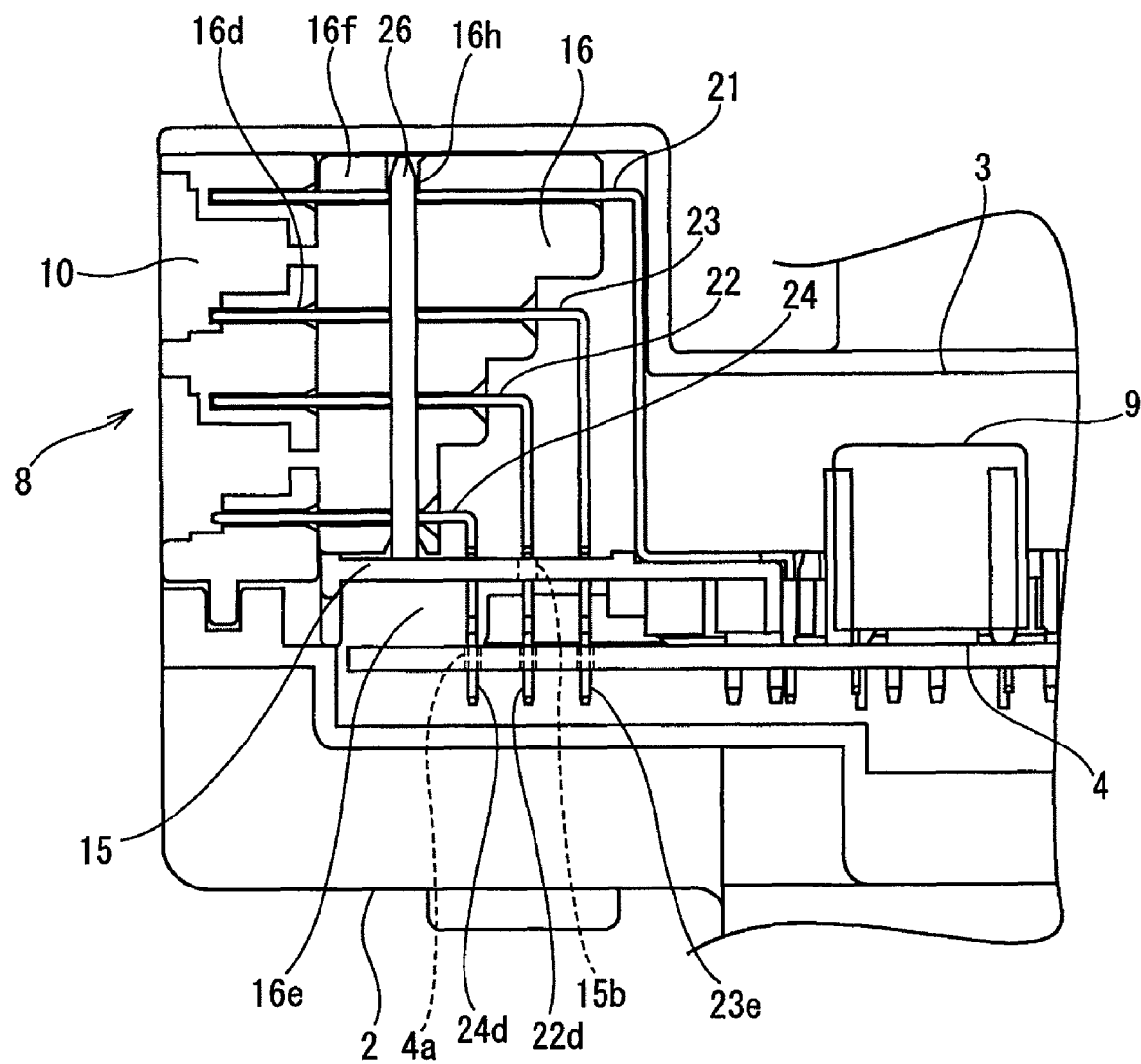

[Fig. 6]
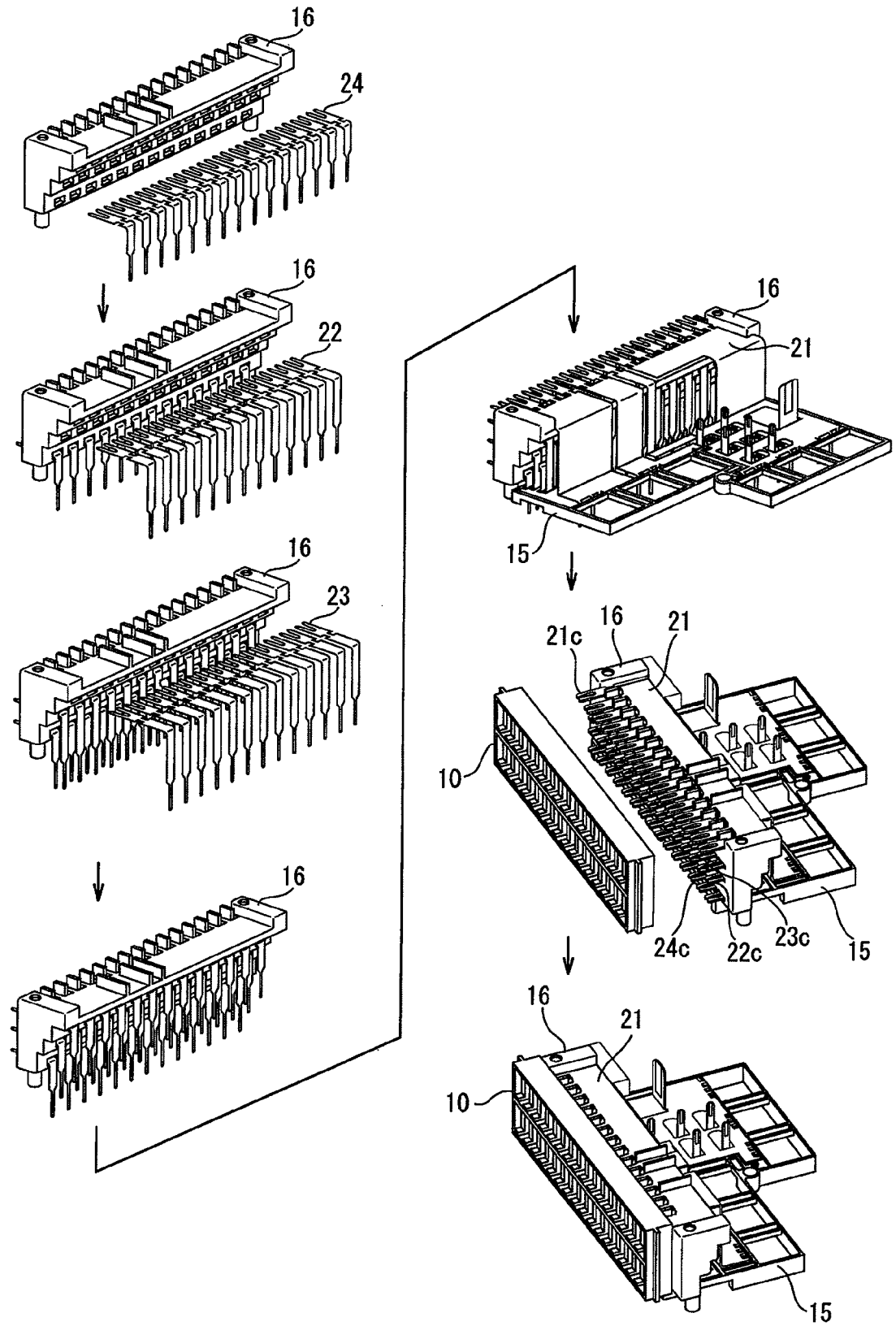

[Fig. 7]
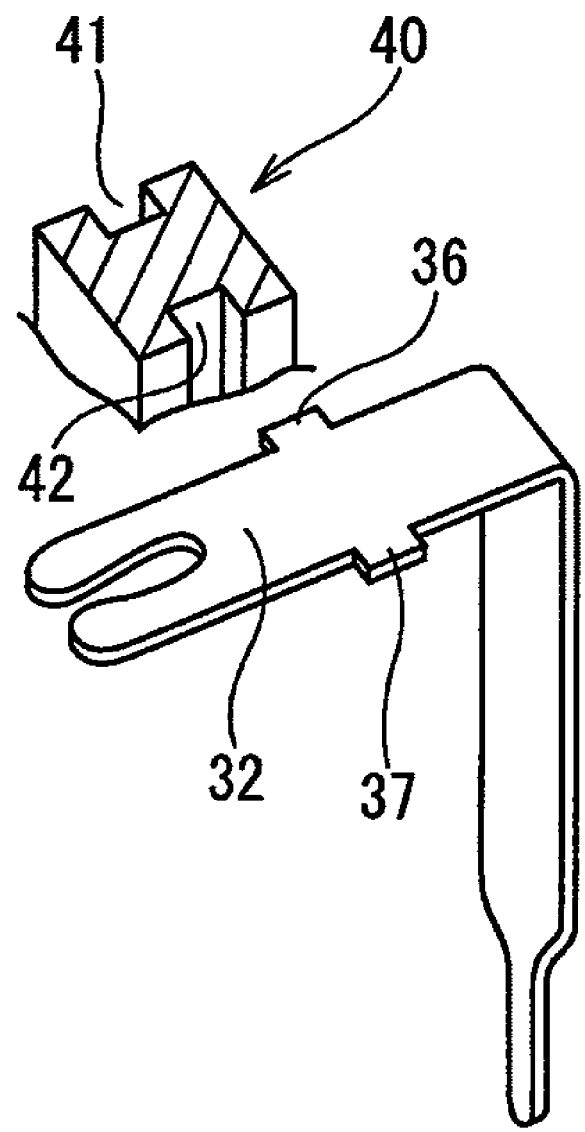

[Fig. 8]
Prior Art
(A)
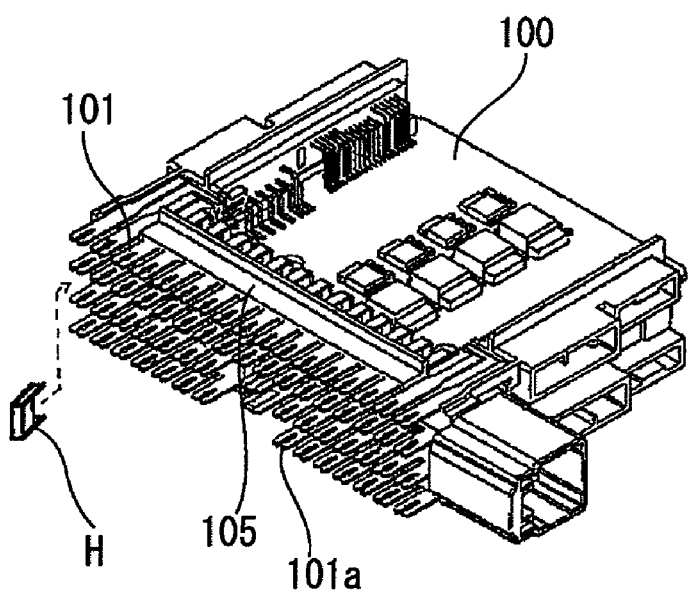
(B)
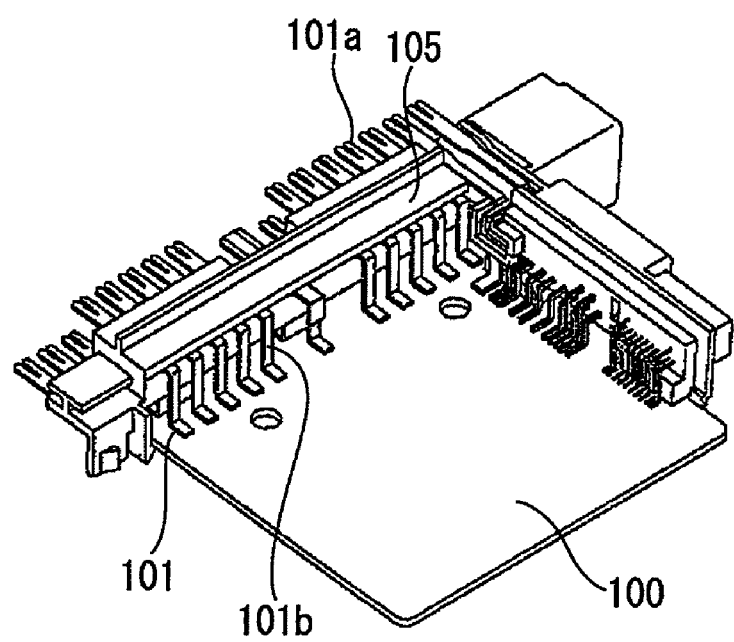

ELECTRICAL JUNCTION BOX

The present application claims priority under 35 U.S.C. §119 of Japanese Application No. 2009-029325, filed on Feb. 12, 2009, the disclosure of which is expressly incorporated by reference herein in its entirety.

TECHNICAL FIELD

This invention relates to an electrical junction box and more particularly relates to an electrical junction box to be mounted on a motor vehicle, wherein external terminals such as fuses are inserted in and connected to the electrical junction box, internal terminals are provided on internal circuit member in the box, supporting strength of the internal terminals can be enhanced when the external and internal terminals are coupled to one another.

BACKGROUND ART

In an electrical junction box such as a junction box to be mounted on a motor vehicle, fuses are fitted in fuse containing sections provided on an outer surface of the box and connectors connected to distal ends of wire harnesses are fitted in connector containing sections provided on the box to connect a wire harness to an internal circuit member.

An example of such a kind of electrical junction box is shown in FIGS. 8A and 8B and is disclosed in JP 2008-53079 A (Patent Document 1).

A printed board 100 is contained in a casing of the electrical junction box. Many fuse connecting terminals 101 are connected to conductors on the printed board 100 and project from the board 100 to be juxtaposed on a side surface of the casing.

Each terminal 101 is formed into an L-shaped configuration that includes a tuning fork terminal portion 101a and a vertical portion 101b bent downward from the terminal portion 101a.

A tab-like terminal of a fuse H is inserted into and coupled to the tuning fork terminal portion 101a of the terminal 101. In order to prevent the tuning fork portion 101a from being retracted by the coupling force, the terminal 101 is inserted into and held in a fuse terminal holder 105.

Although Patent Document 1 does not detail a holder of the terminals, it will be supposed that the terminals 101 are insert-molded in the fuse terminal holder 105 since the bent portions of the terminals 101 are held by the holder 105.

In the case where the terminals 101 are not bent but straightened, it is necessary to support the terminals 101 so that the terminals 101 are not retracted by press-inserting force when the fuse terminals are inserted into the terminals 101. Accordingly, heretofore, the terminals 101 are previously press-inserted and supported in terminal holes in the fuse terminal holder so that the terminals are not retracted upon fitting the fuses.
[Prior Technical Document]
[Patent Document]
[Patent Document 1] JP 2008-53079 A

DISCLOSURE OF THE INVENTION

Problems that the Invention is to Solve

As described above, it is necessary to insert-mold the terminals in the fuse terminal holder at the side of the electrical junction box or to press-insert the terminals into the terminal holes in the fuse terminal holder so that the terminals are not retracted by a pushing force applied to the terminals upon fitting the fuses in the box.

The insert-molding of the terminals in the fuse terminal holder will cause a great increase in cost, thereby lowering flexibility of increasing or decreasing the number of terminals and of arrangement of the terminals.

The press-inserting of the terminals into the fuse terminal holder will require equipments for press-inserting the terminals, thereby increasing steps in working and causing a great increase in cost.

The similar result will occur in the case where the terminals are provided by bending a bus bar to be contained in the electrical junction box and connector terminals connected to fuse terminals or a wire harness are connected to the bus bar terminals as well as the case where the terminals are attached to the printed board by welding, as disclosed in Patent Document 1. That is, if the terminals bent from the bus bar are not supported so that the terminals can bear the press-inserting force from mating terminals, the terminals will be deformed upon coupling, thereby causing improper mechanical connection and lowering reliability in electrical connection.

In view of the above problem, an object of the present invention is to provide an electrical junction box that does not require a terminal holder for insert-molding of terminals or a terminal holder provided with through-holes for press-supporting of the terminals, and that have a simple mechanism for supporting the terminals so that the terminals are not retracted by a pushing force.

Means for Solving the Problems

In order to overcome the above problem, the present invention is directed to an electrical junction box provided on an outer surface with electrical component containing sections. Terminals are juxtaposed in the containing sections. The terminals are connected to internal circuit member. Each terminal is provided on opposite side edges in a width direction with recesses or protrusions, and support pins project from the electrical junction box or an insulation plate contained in the box so that each support pin is disposed between the adjacent terminals to extend in a direction perpendicular to the terminals and is fitted in the recesses or protrusions.

As described above, according to the present invention, a terminal holder that holds the terminals by allowing the terminals to enter through-holes is not used, the support pins are merely arranged so that the support pins pass the spaces defined between the adjacent terminals out of the juxtaposed terminals in the perpendicular direction. Since the support pins and terminals are engaged with one another by recesses or protrusions, it is possible for the support pins to receive a stress generated when the mating terminals such as fuses are fitted on the terminals in the containing sections, thereby positively preventing the terminals from being retracted.

Preferably, the terminals may be arranged on at least two layers in the perpendicular direction. Each of the support pins is fitted in the recesses or protrusions of the terminals arranged on at least two layers to support the terminals.

In more detail, the support pins are juxtaposed in the horizontal direction on the insulation plate. Each support pin projects upward from the insulation plate to insert into a space defined between the adjacent terminals disposed on plural layers in the vertical direction to position and hold the terminals on the plural layers simultaneously. Thus, it is possible to adjust the positions of the respective terminals and to smoothly carry out a coupling work between the electrical components such as fuses and the mating terminals.

Preferably, each of the terminals is provided on opposite sides in the width direction with recesses, and each of the support pins is fitted at opposite sides in the recesses in the adjacent terminals.

The recesses may be provided in either each terminal or each support pin and the other terminal or support pin may be provided with the protrusions to couple the recesses and protrusions to one another. However, as described above, in the case where the recesses are provided in each terminal, each support pin is formed into the square bar, one side of each support pin is fitted in the recess in one of the adjacent terminals, and the other side of each support pin is fitted in the recess in the other terminal, it is possible to reduce a pitch between the juxtaposed terminals and to form each support pin into a simple square bar. If each terminal is formed into the tuning fork terminal, it is possible to form each mating terminal into a simple flat tab-like terminal.

In the case where each terminal is narrow in width and a pitch between the terminals is wide in distance, each terminal may be provided with the protrusions while each support pin may be provided with the recesses.

The internal circuit member provided with the terminals may be the printed board or bus bar, as disclosed in Patent Document 1. It is not limited that the terminals are bent from the internal circuit member to project from the member. The terminals may extend straight in parallel to an arranging direction of the internal circuit member.

Preferably, the electrical junction box of the present invention includes an upper casing member, a lower casing member, and a module contained in the upper and lower casing members and connected to the internal circuit member. The module includes a base for fixing the terminals on more than two layers, an insulation plate for supporting the base, and a module casing attached to the insulation plate. A plurality of support pins are integrally provided on the insulation plate and the module casing is provided with the electrical component containing sections.

In more detail, it is preferable that the printed board to be contained in the casing is used as the internal circuit member, the fuse module is coupled to one side part of the printed board, and the support pins project from the insulation board of the fuse module.

In the case where the fuse module is disposed on the side surfaces of the upper and lower casing members of the electrical junction box, and the fuse receiving ports are provided in the opening in the casing side surface so that the fuses are inserted into the ports laterally, it is possible to support many fuses on the casing side surface, thereby downsizing the electrical junction box.

The fuse module includes the insulation plate, the fuse base, the fuse casing mounted on the fuse base at the fuse inserting side, and the input and output bus bars punched out from a bus bar. The fuse inserting ports are juxtaposed in the horizontal direction and are disposed on two layers in the vertical direction in the fuse casing.

The terminals provided on the input and output bus bars are bent in the L-shaped configurations to be connected to the conductor on the printed board, as disclosed in Patent Document 1. The horizontal portions are provided with the tuning fork terminals to be connected to the input and output terminals of the fuses. The lower ends of the vertical portions are inserted into and soldered in the through-holes in the conductor on the printed board.

The above structure is not limited to the fuse module. Preferably, the same structure as the fuse module can be applied to a relay module provided with relay containing sections for relays to be inserted, and a connector module provided with connector containing sections for connectors connected to a distal end of a wire harness.

Effects of the Invention

As described above, according to the present invention, terminals of the electrical components such as fuses, relays or connectors can be connected to the terminals of the internal circuit member with assistance of the support pins by means of protrusion or recess engagement. Accordingly, it is possible to prevent the terminals from being retracted by the press-inserting force upon coupling.

Since the support pins project from the insulation plate, it is not necessary to prepare a terminal holder made of a molding product, thereby not increasing the number of parts and lowering a cost.

Furthermore, it is not always to dispose each terminal between the support pins and this can enhance flexibility in arrangement of terminals.

BRIEF EXPLANATION OF THE DRAWINGS

FIG. 1A is a perspective view of an embodiment of an electrical junction box in accordance with the present invention. FIG. 1B is an exploded perspective view of the electrical junction box shown in FIG. 1A.

FIG. 2A is a perspective view of a fuse module to be contained in the electrical junction box shown in FIG. 1A. FIG. 2B is an exploded perspective view of the fuse module shown in FIG. 2A.

FIG. 3 is a perspective view of a fuse terminal to be attached to the fuse module shown in FIG. 2A.

FIG. 4A is a perspective view of a main part of the electrical junction box shown in FIG. 1A. FIG. 4B is a front elevation view of the main part of the electrical junction box shown in FIG. 4A, illustrating a fitting condition between support pins and terminals.

FIG. 5 is a section view of the fuse module, illustrating the fuse module mounted on a printed board.

FIG. 6 is an exploded perspective view of the fuse module, illustrating a process of assembling the fuse module.

FIG. 7 is a perspective view of an alteration of the fuse terminal.

FIGS. 8A and 8B are perspective views of prior art fuse modules.

PREFERRED ASPECTS OF EMBODYING THE INVENTION

Referring now to the drawings, an embodiment of an electrical junction box in accordance with the present invention will be described below.

An electrical junction box in the embodiment of the present invention is a junction box that is mounted on a motor vehicle.

As shown in FIGS. 1A and 1B, an electrical junction box 1 includes a lower casing member 2, an upper casing member 3, and an internal circuit member having a printed board 4 and contained between the upper and lower casing members 3 and 2. The upper casing member 3 is provided on an upper wall with connector containing sections 5. When the upper and lower casing members 3 and 2 are coupled to each other, an opening 7 is defined in a side surface of a coupled casing. A fuse casing 10 is disposed in the opening 7. The fuse casing 10 of a fuse module 8 mounted on a side part of the printed board 4 is disposed in the opening 7.

The printed board 4 is provided on an upper surface with board mounting relays 9 connected to a conductor on the printed board 4 and with connector connecting terminals 12 supported on a base 11, and the printed board 4 is also provided on a lower surface with connector connecting terminals. An insulation plate 15 of the fuse module 8 is secured to one side part (left side part in FIG. 1B) of the upper surface of the printed board 4.

As shown in FIGS. 2A and 2B, the fuse module 8 includes the insulation plate 15, a fuse base 16, the fuse casing 10, an input side bus bar 20 having first input terminals 21 at a side of an electrical power source, second input terminals 22, first output terminals 23, and second output terminals 24.

The insulation plate 15, fuse base 16, fuse casing 10 are made of insulation resin molding products, respectively.

The input side bus bar 20 having the first input terminals 21, the second input terminals 22, and the first and second output terminals 23 and 24 are formed by punching out a copper base metallic sheet.

The second input terminals 22 and first and second output terminals 23 and 24 are formed into reversed L-shaped configurations in which horizontal portions 22b to 24b extend from upper ends of vertical portions 22a to 24a. Tuning fork terminals 22c to 24c are provided on distal ends of the horizontal portions 22b to 24b.

The first input terminals 21 are set at a side of an electrical power source. The input side bus bar 20 having the first input terminals 21 includes horizontal portions 21d and vertical portions 21a that are bent from distal ends of the horizontal portions 21d. Second horizontal portions 21b are provided on upper ends of the vertical portions 21a. A plurality of tuning fork terminals 21c are juxtaposed on the distal ends of the second horizontal portions 21b. A first horizontal portion 21d is provided with an electrical power source connecting terminal 21f, an FL terminal 21g, and a connecting terminal 21h to be connected to the printed board 4.

As shown in FIG. 3, the second input terminal 22 and first and second output terminals 23 and 24 are punched out from proximal ends of the tuning fork terminals 22c to 24c to distal ends of the vertical portions 22a to 24a to divide them individually. Each of the vertical portions 22a to 24a is provided on each lower end with conductor connecting terminals 22d to 24d that are inserted into and soldered in terminal holes 4a (FIG. 5) in the conductor on the printed board 4.

The tuning terminals 21c to 24c of the horizontal portions of the first and second input terminals 21 and 22 and the first and second output terminals 23 and 24 are arranged in a vertical direction in order from the first input terminal 21 through the first output terminal 23 and second input terminal 22 to the second output terminal 24.

The respective tuning fork terminals 21c to 24c have the same configurations. The tuning fork 22c shown in FIG. 3 is described as a representative example below. The tuning fork 22c includes a pair of clipping pieces 30 and 31 provided on a distal end of the horizontal portion 22b and a proximal portion 32 for coupling the clipping pieces 30, 31 to each other. The proximal portion 32 is provided in opposite sides in a width direction with recesses 33 and 34. A tab-like output terminal 51 of a fuse 50 is press-inserted between the clipping pieces 30 and 31 while an input terminal 52 of the fuse 50 is press-inserted into the first and second input terminals 21 and 22.

As shown in FIG. 2B, the insulation plate 15 is provided with square bar-like support pins 26 juxtaposed on a front end side of the horizontal proximal end 15a in teeth of a comb.

As shown in FIG. 4B, the support pins 26 are inserted into spaces between the adjacent first and second input terminals 21 and 22 juxtaposed in the horizontal direction and spaces between the adjacent first and second output terminals 23 and 24 juxtaposed in the horizontal direction so that the support pins 26 are fitted in the recesses 33 and 34 in the first and second input terminals 21 and 22 and the first and second output terminals 33 and 34 disposed at the same positions in the vertical direction.

The insulation plate 15 is provided in the proximal portion 15a with through-holes 15b (FIG. 5) for the conductor connecting terminals 22d to 24d of the second input terminals 22 and the first and second output terminals 23 and 24. A first horizontal portion 21d of an input side bus bar 20 is mounted on the proximal portion 15a of the insulation plate 15.

Furthermore, the insulation plate 15 is provided on a peripheral edge of the proximal portion 15a with a plurality of support frame portions 15c. Relays 9 mounted on the printed board 4 are inserted into openings 15d surrounded by the support frame portions 15c.

The fuse base 16 is formed into a frame-like configuration having a front wall 16a, an upper wall 16b, and right and left side walls 16c. The first input terminals 21 are disposed from an upper surface of the upper wall 16b to a rear surface of the upper wall 16b. Partition walls 16f for the respective tuning fork terminals 21c are provided on the upper wall 16b. The tuning fork terminals 21c project from a front end of the upper wall 16b between the partition walls 16f. The respective partitions 16f are provided in rear ends with apertures 16h for passing the support pins 26.

The front wall 16a is provided with terminal holes 16d that are juxtaposed in a horizontal direction and disposed in three layers in a vertical direction. The tuning forks 23c of the first output terminals 23 are inserted into the uppermost layer terminal holes 16d, the tuning forks 23c of the second input terminals 22 are inserted into the middle layer terminal holes 16d, and the tuning forks 23c of the second output terminals 24 are inserted into the lowermost terminal holes 16d. The respective tuning fork terminals project from the front ends of the partition walls 16f.

Threaded bosses 16e project from lower ends of the right and left side walls 16c of the fuse base 16 and the threaded bosses 16e are secured to the printed board 4 by nuts. Means for securing the fuse base 16 to the printed board 4 is not limited to the screws and nuts.

The fuse casing 10 receives the fuses 50 to be attached to the front surface of the fuse base 16. The fuse casing 10 is formed into a rectangular parallelepiped configuration and is provided with a plurality of fuse containing sections 10a juxtaposed in the horizontal direction and disposed in two layers in the vertical direction. The fuse containing sections 10a are provided in the bottom walls with through-holes that receive the tuning fork terminals 21c to 24c of the first and second output terminals 21 to 24. The tuning fork terminals 21c to 24c are inserted into the through-holes to project into the fuse containing sections 10a.

A process for assembling the fuse module 8 is carried out by the following steps. Firstly, as shown in FIG. 6, the second output terminals 24 at the lowermost layer are set on the fuse base 16. Secondly, the second input terminals 22 and the first output terminals 23 are set on the fuse base 16 in order.

Thirdly, the insulation plate 15 is attached to the lower part of the fuse base 16. Fourthly, the input side bus bar 20 is attached to the fuse base 16 from the upper surface to the rear side of the fuse base 16 and is mounted on the proximal portion 15a of the insulation plate 15.

Finally, the fuse casing 10 is secured to the front side of the fuse base 16.

The fuse module 8 thus assembled is disposed near the side of the printed board 4. The proximal portion 15a and support frame portion 15c of the insulation plate 15 are mounted on the top surface of the printed board 4.

When the insulation plate 15 is mounted on the top surface of the printed board 4, the conductor connecting terminals 21d to 24d of the first and second input terminals 21 and 22 and first and second output terminals 23 and 24 are inserted into the through-holes in the printed board 4.

Then, at the same time when the other components are soldered on the top surface of the printed board 4, the first and second input terminals 21 and 22 and first and second output terminals 23 and 24 are connected to the conductors on the printed board 4 by means of flow soldering.

This soldering process causes the first input terminals 21 to be connected to an electrical power source circuit on the printed board 4, the second input terminals 22 to be connected to another input circuit, and the first and second output terminals 23 and 24 to be connected to an output circuit, respectively.

As described above, after the fuse module 8 is secured to the printed board 4, the fuse module 8 together with the printed board 4 are contained between the upper and lower casing members 3 and 2, and the fuse casing 10 is disposed in the opening in the side walls of the casing members 2 and 3.

When the fuse module 8 is assembled and the insulation plate 15 is secured to the fuse base 16, the support pins 24 project in the vertical direction between the second input terminals 22 and the first and second output terminals 23 and 24 that are disposed adjacent to one another in the horizontal direction, as shown in FIGS. 4A and 4B. The support pins 26 are inserted into the recesses 33 and 34 in the second input terminals 22 and first and second output terminals 23 and 24 that are disposed on the upper and lower layer in the vertical direction, and are spaced apart from one another and are fitted in the recesses 33 and 34.

In more detail, the one side portion 26a (right side portion in FIG. 4B) of each support pin 26 is fitted in the recess 33 in one of the adjacent terminals in the horizontal direction while the other side portion 26b (left side portion in FIG. 4B) of each support pin 26 is fitted in the recess 34 in the other of the adjacent terminals in the horizontal direction.

When the first input terminals 21 are attached to the fuse base 16, the support pins 26 are inserted into the through-holes 16h and are fitted in the recesses 33 and 34 in the adjacent first input terminals 21 in the horizontal direction.

Thus, the adjacent support pins 26 are fitted in the recesses 33 and 34 provided in the proximal portions 32 of the tuning fork terminals 21c to 24c of the first and second input terminals 21 and 22 and first and second output terminals 23 and 24, whereby the support pins 26 position and hold the terminals 21 to 24.

When the fuses 50 are laterally inserted into and connected to the fuse containing sections 10a on the fuse casing 10 in the electrical junction box 1, the tab-like output terminals 51 and input terminals 52 of the fuses 50 are press-fitted in the tuning fork terminals 21c to 24c. Consequently, although the tuning fork terminals 21c to 24c are subject to a load in a retracting direction, the support pins 26 can receive the press-fitting force, since the support pins 26 position and hold the tuning fork terminals 21c to 24c at the opposite sides of them in the width direction. Accordingly, the tuning fork terminals are not retracted and the fuses 50 are smoothly fitted in the fuse containing sections 10a by a constant coupling force.

Since the support pins 26 project form the insulation plate 15 that is required to fix the fuse module 8 on the printed board 4, it is not necessary to prepare additional parts for providing the support pins, thereby not increasing the number of parts. When the fuse base 16 is set on the insulation plate 15, the support pins are automatically inserted into the respective recesses 33 and 34. When the first input terminals 21 are set on the fuse base 16, since the support pins are inserted into the recesses 33 and 34 in the first input terminals 21, it is not necessary to increase a step for supporting the terminals.

It should be noted that the present invention is not limited to the above embodiment. For example, as shown in FIG. 7, the proximal portion 32 of each tuning fork terminal may be provided on the opposite sides in the width direction with protrusions 36 and 37 in lieu of the recesses 33 and 34 in the width direction and each support pin 40 may be provided on the right and left sides with recesses 41 and 42.

In the case where the terminals are narrow and pitches of juxtaposed terminals are great, the above structure will be suitable for keeping strength of the terminals.

In addition, although the fuses are disposed at two layers in the vertical direction in the above embodiment, the fuses may be disposed at one layer or at more than three layers.

Although the fuse module is provided in the above embodiment and the support pins project from the insulation plate of the fuse module, in the case where the fuse containing sections are provided on the casing without providing any fuse module, the support pins may be formed integrally on a bottom wall of the casing.

Furthermore, the terminals are not limited to the fuse connecting fuses. In the case where the connector containing sections are disposed on the side surface of the casing and the connector connecting terminals project from the bus bar in an L-shape, it is preferable to provide support pins for positioning and holding the terminals.

What is claimed is:

1. An electrical junction box having electrical component containing sections on an outer surface thereof, said electrical junction box comprising:
   terminals juxtaposed in said containing sections, said terminals being connected to an internal circuit member, each terminal being provided on opposite side edges in a width direction with one of recesses or protrusions; and
   support pins extending from one of said electrical junction box or an insulation plate contained in said electrical junction box, each of said support pins extending between adjacent ones of said terminals in a direction perpendicular to said terminals, in such a manner that each of said support pins is fitted in said recesses or protrusions.

2. The electrical junction box according to claim 1, wherein said terminals are arranged in at least two layers in said perpendicular direction, each of said support pins being fitted in said recesses or protrusions of said terminals arranged in at least two layers to support said terminals.

3. The electrical junction box according to claim 1, wherein each of said terminals is provided on opposite side edges in the width direction with recesses, and each of said support pins is fitted at opposite sides in said recesses in adjacent ones of said terminals.

4. The electrical junction box according to claim 2, wherein each of said terminals is provided on opposite side edges in the width direction with recesses, and each of said support pins is fitted at opposite sides in said recesses in adjacent ones of said terminals.

5. The electrical junction box according to claim 1, further comprising an upper casing member, a lower casing member, and a module contained in said upper and lower casing members and connected to said internal circuit member, wherein said module includes a base for fixing said terminals arranged in more than two layers, an insulation plate for supporting said base, and a module casing attached to said insulation plate, and wherein a plurality of said support pins are integrally provided on said insulation plate, and said module casing is provided with said electrical component containing sections.

6. The electrical junction box according to claim 2, further comprising an upper casing member, a lower casing member, and a module contained in said upper and lower casing members and connected to said internal circuit member, wherein said module includes a base for fixing said terminals arranged in more than two layers, an insulation plate for supporting said base, and a module casing attached to said insulation plate, and wherein a plurality of said support pins are integrally provided on said insulation plate, and said module casing is provided with said electrical component containing sections.

7. The electrical junction box according to claim 3, further comprising an upper casing member, a lower casing member, and a module contained in said upper and lower casing members and connected to said internal circuit member, wherein said module includes a base for fixing said terminals arranged in more than two layers, an insulation plate for supporting said base, and a module casing attached to said insulation plate, and wherein a plurality of said support pins are integrally provided on said insulation plate, and said module casing is provided with said electrical component containing sections.

8. The electrical junction box according to claim 4, further comprising an upper casing member, a lower casing member, and a module contained in said upper and lower casing members and connected to said internal circuit member, wherein said module includes a base for fixing said terminals arranged in more than two layers, an insulation plate for supporting said base, and a module casing attached to said insulation plate, and wherein a plurality of said support pins are integrally provided on said insulation plate, and said module casing is provided with said electrical component containing sections.

* * * * *